United States Patent
Lee et al.

(10) Patent No.: US 9,041,181 B2
(45) Date of Patent: May 26, 2015

(54) LAND GRID ARRAY PACKAGE CAPABLE OF DECREASING A HEIGHT DIFFERENCE BETWEEN A LAND AND A SOLDER RESIST

(75) Inventors: Hee-chul Lee, Hwaseong-si (KR); Myung-kee Chung, Cheonan-si (KR); Kun-dae Yeom, Cheonan-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 1091 days.

(21) Appl. No.: 13/024,785

(22) Filed: Feb. 10, 2011

(65) Prior Publication Data
US 2011/0198744 A1 Aug. 18, 2011

(30) Foreign Application Priority Data
Feb. 16, 2010 (KR) .................. 10-2010-0013855

(51) Int. Cl.
*H01L 23/48* (2006.01)
*H01L 23/52* (2006.01)
*H01L 29/40* (2006.01)
*H01L 23/31* (2006.01)
(Continued)

(52) U.S. Cl.
CPC ... *H01L 23/3121* (2013.01); *H01L 2924/15313* (2013.01); *H01L 2224/09517* (2013.01); *H01L 2224/33517* (2013.01); *H01L 23/49811* (2013.01); *H01L 2224/32225* (2013.01); *H01L 2224/48091* (2013.01); *H01L 2224/48227* (2013.01); *H01L 2224/73265* (2013.01); *H01L 24/48* (2013.01); *Y10S 438/948* (2013.01)

(58) Field of Classification Search
CPC ............. H01L 2924/00; H01L 2224/48227; H01L 2224/3224; H01L 2224/73265; H01L 2924/15323; H01L 2224/32224; H01L 2224/32225; H01L 2924/15313; H01L 2924/15333; H01L 21/4821; H01L 21/4839; H01L 2224/09517; H01L 2224/35517; H01L 23/3121; H01L 23/49811; H01L 23/498; H01L 2224/48091; H01L 2924/00014; H01L 2924/00012; H01L 2224/33517; H01L 24/48
USPC ........... 257/690, 773, E21.523, E23.02, 734, 257/767, 786, E21.259, E21.492; 361/719, 361/720, 748, 760, 777; 438/725, 948
See application file for complete search history.

(56) References Cited

U.S. PATENT DOCUMENTS

| | | | |
|---|---|---|---|
| 5,914,859 A * | 6/1999 | Takada et al. | 361/704 |
| 6,396,707 B1 * | 5/2002 | Huang et al. | 361/760 |
| 6,627,986 B2 * | 9/2003 | Ishihara et al. | 257/690 |

(Continued)

FOREIGN PATENT DOCUMENTS

| | | | | |
|---|---|---|---|---|
| CN | 1877829 | 12/2006 | | |
| JP | 08107264 A * | 4/1996 | | H05K 3/28 |

(Continued)

OTHER PUBLICATIONS

Chinese Office Action dated May 12, 2014 corresponding to related Chinese Patent Appln. No. 201110038739.8.

*Primary Examiner* — Teresa M Arroyo
(74) *Attorney, Agent, or Firm* — F. Chau & Associates, LLC

(57) ABSTRACT

A land grid array (LGA) package including a substrate having a plurality of lands formed on a first surface of the substrate, a semiconductor chip mounted on a second surface of the substrate, a connection portion connecting the semiconductor chip and the substrate, and a support layer formed on part of a surface of a first land.

13 Claims, 9 Drawing Sheets

(51) Int. Cl.
*H01L 23/498* (2006.01)
*H01L 23/00* (2006.01)

(56) References Cited

U.S. PATENT DOCUMENTS

| | | | | |
|---|---|---|---|---|
| 7,164,815 | B2 * | 1/2007 | Yanagisawa et al. | 385/14 |
| 7,399,694 | B2 | 7/2008 | Kikuchi et al. | |
| 7,521,800 | B2 | 4/2009 | Chu et al. | |
| 2001/0026010 | A1 * | 10/2001 | Horiuchi et al. | 257/678 |
| 2002/0033378 | A1 * | 3/2002 | Hayashi et al. | 216/11 |
| 2004/0179344 | A1 * | 9/2004 | Uchida et al. | 361/777 |
| 2006/0055033 | A1 * | 3/2006 | Kheng | 257/734 |
| 2006/0279315 | A1 * | 12/2006 | Takagi et al. | 324/765 |
| 2007/0170578 | A1 * | 7/2007 | Yoshikawa et al. | 257/700 |
| 2010/0252304 | A1 * | 10/2010 | Muramatsu et al. | 174/251 |
| 2010/0301473 | A1 * | 12/2010 | Sasaoka | 257/737 |

FOREIGN PATENT DOCUMENTS

| | | | | |
|---|---|---|---|---|
| JP | 2002290031 A | * | 10/2002 | H05K 3/46 |
| KR | 1020080012045 | | 2/2008 | |
| KR | 1020090039269 | | 4/2009 | |

* cited by examiner

LAND GRID ARRAY PACKAGE CAPABLE OF DECREASING A HEIGHT DIFFERENCE BETWEEN A LAND AND A SOLDER RESIST

CROSS-REFERENCE TO RELATED APPLICATION

This application claims priority under 35 U.S.C. §119 to Korean Patent Application No. 10-2010-0013855, filed on Feb. 16, 2010, in the Korean Intellectual Property Office, the disclosure of which is incorporated by reference herein in its entirety.

BACKGROUND

1. Technical Field

The inventive concept relates to a semiconductor package having a small thickness, and more particularly, to a land grid array (LGA) package in which a height difference between a land and a solder resist formed on a substrate of the LGA package is decreased.

2. Discussion of the Related Art

As mobile systems, portable computers, or the like on which semiconductor packages are mounted become smaller and thinner, the semiconductor packages themselves also become smaller and thinner. Among these semiconductor packages, land grid array (LGA) packages have a structure similar to that of ball grid array (BGA) packages, except that solder balls are not adhered to the LGA packages.

Thus, the LGA packages may be smaller than the BGA packages and may be mounted on a printed circuit board (PCB) without using solder balls including lead that is harmful to the human body. Rather, such connection can be made by using a lead free paste. Thus, in countries where the use of certain semiconductor package products due to environmental concerns has been restricted, the LGA packages have drawn attention as environment-friendly "green" products.

Further, because of their reliability, microprocessors made by Intel Corporation or Advanced Micro Devices use LGA packages as a physical interface. In contrast to other semiconductor packages, land terminals of the LGA packages can be freely arranged, and when the LGA packages are mounted on a PCB, the height of the LGA packages may be smaller than that of other semiconductor packages.

However, because of a height difference between a land terminal and a solder resist formed on a substrate of an LGA package, a semiconductor chip in the LGA package is susceptible to damage. Accordingly, there is a need to reduce this height difference.

SUMMARY

An exemplary embodiment of the inventive concept provides a land grid array (LGA) package that can decrease a height difference between a solder resist and a land, which are disposed on a lower portion of a substrate of the LGA package.

An exemplary embodiment of the inventive concept also provides a semiconductor package that can decrease a height difference between a solder resist and a land, which are disposed on a lower portion of a substrate of the semiconductor package.

An exemplary embodiment of the inventive concept also provides an electronic device including the LGA package.

According to an exemplary embodiment of the inventive concept, there is provided an LGA package including: a substrate, the substrate including a plurality of lands formed on a first surface of the substrate; a semiconductor chip mounted on a second surface of the substrate; a connection portion connecting the semiconductor chip and the substrate; and a support layer formed on part of a surface of a first land.

The support layer may include a solder resist. A height of the support layer may be equal to or smaller than a height of a solder resist formed on the first surface of the substrate.

The support layer may include an open space to allow a test terminal to contact the first land. The support layer may be connected to a solder resist formed on the first surface of the substrate. The support layer may not be connected to a solder resist formed on the first surface of the substrate. The support layer may include a plurality of separate layers. The support layer may be formed by connecting a plurality of separate layers.

A width of the first land opened by a solder resist may be about 0.7 mm or higher. The semiconductor chip may have a thickness of about 50 μm to about 150 μm. The connection portion may be a wire.

The LGA package may further include a sealing member sealing the second surface of the substrate and the semiconductor chip.

According to an exemplary embodiment of the inventive concept, there is provided a semiconductor package including: a substrate, the substrate including a plurality of lands formed on a first surface of the substrate; a semiconductor chip mounted on a second surface of the substrate; a sealing member sealing the second surface of the substrate and the semiconductor chip; and a support layer formed on part of a surface of a first land.

The support layer may include a solder resist. A height of the support layer may be equal to or smaller than a height of a solder resist formed on the first surface of the substrate.

A width of the first land opened by a solder resist may be about 0.7 mm or higher. The semiconductor chip may have a thickness of about 50 μm to about 150 μm.

According to an exemplary embodiment of the inventive concept, there is provided an electronic device including: a printed circuit board (PCB) for driving the electronic device; and a land grid array (LGA) package mounted on the PCB, wherein the LGA package includes: a substrate, the substrate including a plurality of lands formed on a first surface of the substrate; a semiconductor chip mounted on a second surface of the substrate; a sealing member sealing the second surface of the substrate and the semiconductor chip; a connection portion connecting the semiconductor chip and the substrate; and a support layer formed on part of a surface of a first land.

The support layer may include a solder resist. A height of the support layer may be equal to or smaller than a height of a solder resist formed on the first surface of the substrate.

BRIEF DESCRIPTION OF THE DRAWINGS

The above and other features of the inventive concept will become more apparent by describing in detail exemplary embodiments thereof with reference to the accompanying drawings in which.

DETAILED DESCRIPTION OF THE EMBODIMENTS

Exemplary embodiments of the inventive concept will be described more fully hereinafter with reference to the accompanying drawings. The inventive concept may, however, be embodied in many different forms and should not be construed as being limited to the embodiments set forth herein.

Figure 1:
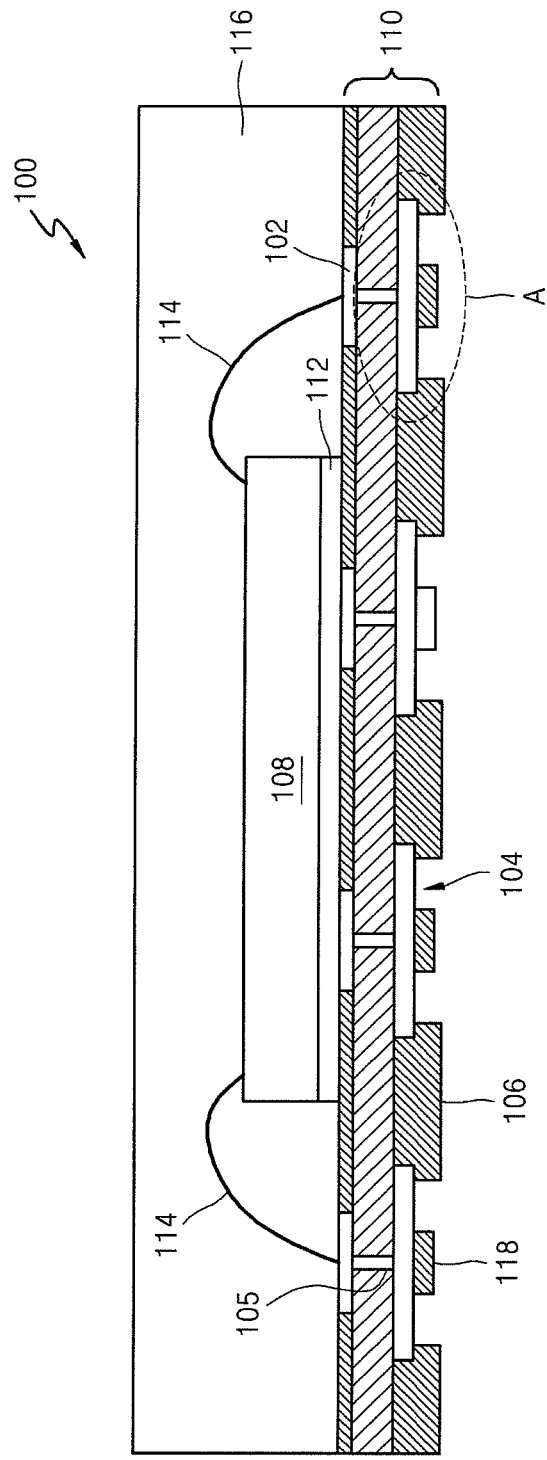
FIG. 1 is a cross-sectional view of a land grid array (LGA) package according to an exemplary embodiment of the inventive concept.

FIG. 1 is a cross-sectional view of a land grid array (LGA) package 100 according to an exemplary embodiment of the inventive concept. Referring to FIG. 1, the LGA package 100 according to the current embodiment of the inventive concept includes a substrate 110 for manufacturing a semiconductor package, the substrate 110 including a plurality of lands 104 formed on a bottom surface of the substrate 110. The substrate 110 includes a bond finger 102, which is formed on a top surface of a main body of the substrate 110, to which a wire 114 may be connected. The main body of the substrate 110 is formed of an insulating material. The lands 104, which are formed on a bottom surface of the main body of the substrate 110, are to be connected to a printed circuit board (PCB) (not shown) on which the semiconductor package is to be mounted. The LGA package 100 and the PCB may be connected to each other via a lead free paste in an environmentally friendly manner. The lands 104 and the bond finger 102 are connected to each other via a through hole 105 formed in the substrate 110. In addition, the surfaces of the substrate 110 including the lands 104 and the bond finger 102 are covered by a solder resist 106.

The LGA package 100 of FIG. 1 further includes a semiconductor chip 108 mounted on the top surface of the substrate 110. A bottom surface of the semiconductor chip 108 may be grinded by back grinding. The thickness of the semiconductor chip 108 is in the range of about 50 μm to about 150 μm. As will be discussed later, as the semiconductor chip 108 becomes more susceptible to cracks, the effect of exemplary embodiments of the inventive concept is increased. The semiconductor chip 108 is mounted on the substrate 110 via a die attachment film (DAF) 112 attached to the bottom surface of the semiconductor chip 108. However, the semiconductor chip 108 may also be mounted on the substrate 110 by using a bump formed on the top surface of the semiconductor chip 108 as a connection portion. The semiconductor chip 108 may be a semiconductor device having a memory function, a semiconductor device having a logic function, or a semiconductor device having a function of a controller or a microprocessor.

The LGA package 100 of FIG. 1 further includes the wire 114 that is a connection portion for connecting the semiconductor chip 108 and the substrate 110. In the current embodiment, the wire 114 is used as the connection portion. However, the semiconductor chip 108 and the substrate 110 may be electrically connected to each other by using the bump formed on the semiconductor chip 108 described above.

The LGA package 100 of FIG. 1 further includes a sealing member 116 for sealing the top surface of the substrate 110, the semiconductor chip 108, and the wire 114 that is the connection portion. The sealing member 116 may be formed of a resin such as an epoxy mold compound (EMC). In addition, the sealing member 116 may be formed using a metal cap instead of the EMC. When the bump is used to connect the semiconductor chip 108 and the substrate 110, the sealing member 116 may also be formed to seal only a side surface of the semiconductor chip 108.

The LGA package 100 of FIG. 1 further includes a support layer 118 partially formed on the surface of the lands 104. The support layer 118 will be described later in detail with reference to the drawings.

Another type of semiconductor package having a small thickness, for example, a ball grid array (BGA) package or a flip chip package, as well as the LGA package 100 of FIG. 1 may include the support layer 118 separately formed on the surface of the lands 104.

Figure 2:
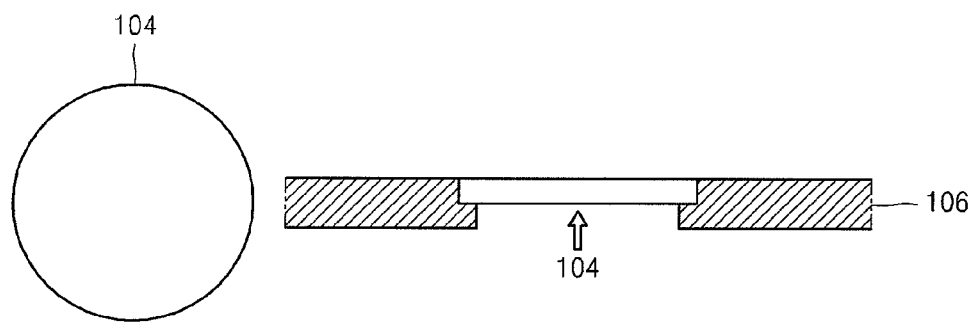
FIG. 2 shows a plan view and a cross-sectional view when no support layer is formed in the LGA package of FIG. 1.
Figure 3:
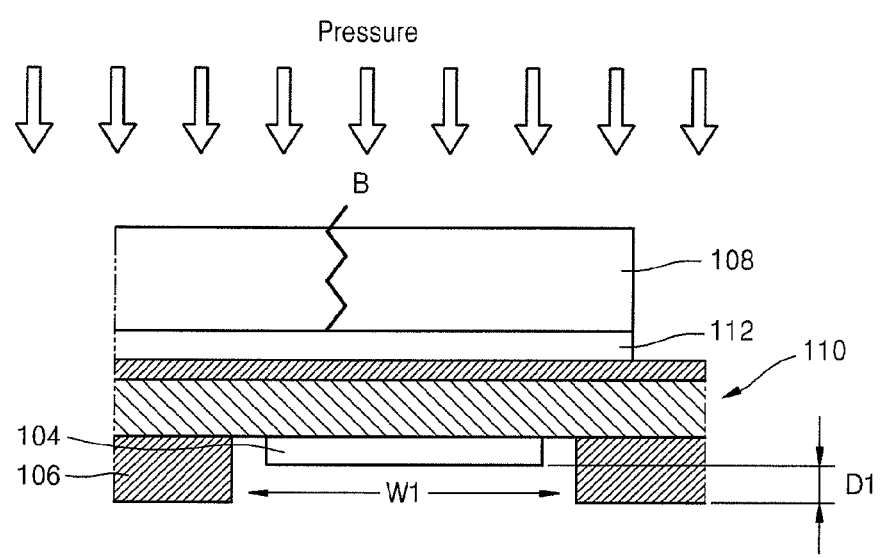
FIG. 3 is a cross-sectional view illustrating damage that occurs in a semiconductor chip when pressure is applied to an outer side of the LGA package of FIG. 1.

FIG. 2 is a plan view and a cross-sectional view in which no support layer is formed in the LGA package 100 of FIG. 1, and FIG. 3 is a cross-sectional view illustrating damage that occurs in a semiconductor chip when pressure is applied to an outer side of the LGA package 100 of FIG. 1.

Referring to FIGS. 2 and 3, each of the lands 104 is opened by the solder resist 106, and another structure is not installed on the surface of the land 104 because, after the LGA package 100 is manufactured, a POGO pin that is a connection terminal in an electrical test process may stably contact the land 104, and after the LGA package 100 is manufactured, the land 104 may be stably bonded to a lead free paste when the LGA package 100 is mounted on the PCB.

However, as shown in FIG. 3, a width W1 where the land 104 is opened by the solder resist 106 is large and a height difference D1 between the land 104 and the solder resist 106 that are formed on the bottom surface of the substrate 110 is increased to several tens of μm. A stress may be concentrated on an area in which a height difference between the land 104 and the solder resist 106 occurs, in a molding process and in other treatment processes after a die attachment process of mounting the semiconductor chip 108 on the substrate 110 is performed. The stress may cause the substrate 110 to bend, and bending of the substrate 110 may cause damage in the semiconductor chip 108 mounted on the substrate 110. Portion B of FIG. 3 indicates a crack defect that occurs in the semiconductor chip 108 in a portion perpendicular to the area in which the height difference between the land 104 and the solder resist 106 occurs. The crack defect B is a fatal defect in a process of manufacturing the LGA package 100.

Figure 4:
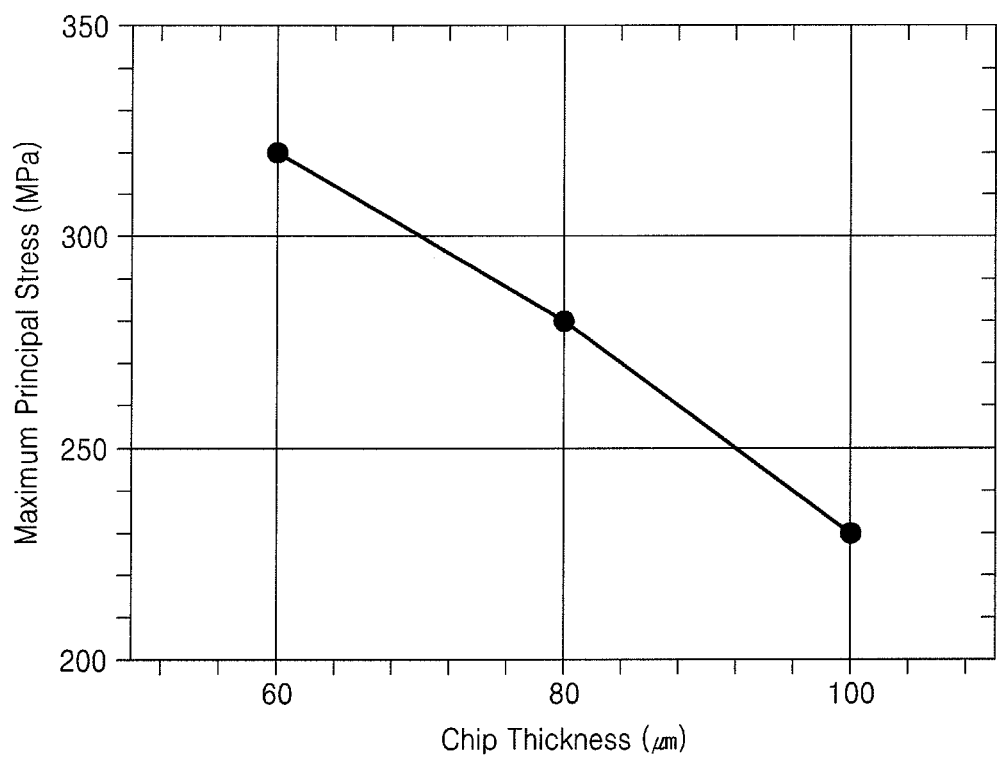
FIG. 4 is a graph for simulation of stress that occurs in a semiconductor chip according to a thickness variation in the semiconductor chip.
Figure 5:
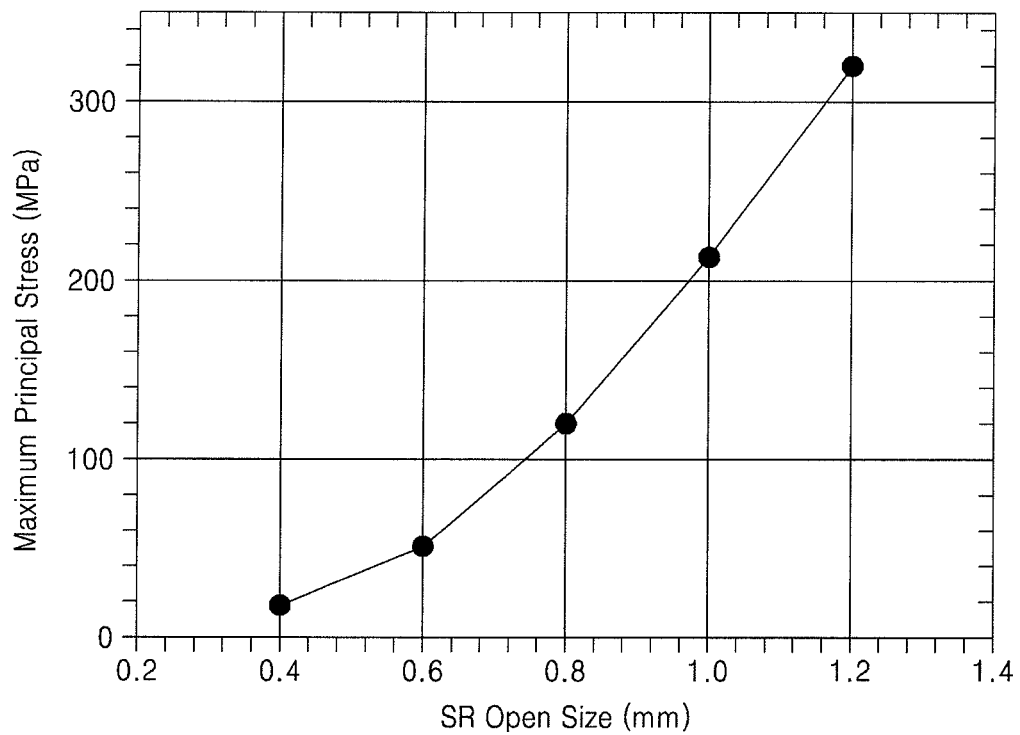
FIG. 5 is a graph for simulation of stress that occurs in a semiconductor chip according to a size variation in a land opened by a solder resist.

FIG. 4 is a graph for simulation of stress that occurs in a semiconductor chip according to a thickness variation in the semiconductor chip, and FIG. 5 is a graph for simulation of stress that occurs in a semiconductor chip according to a size variation in a land opened by a solder resist.

Referring to FIGS. 4 and 5, the X-axis of FIG. 4 represents the thickness of the semiconductor chip in units of [μm], and the Y-axis of FIG. 4 represents a stress applied to the semiconductor chip in units of [MPa]. In addition, the X-axis of FIG. 5 represents the width W1 (see FIG. 3) where the land is opened by the solder resist in units of [mm], and the Y-axis of FIG. 5 represents a stress applied to the semiconductor chip in units of [MPa]. As a result of simulation, when a stress of about 100 MPa is applied to the substrate on which the semiconductor chip is mounted, a crack defect occurs in the semiconductor chip. It can be seen from the simulation result that, when the thickness of the semiconductor chip is 150 μm or higher, a crack defect hardly occurs and when the width W1 (see FIG. 3) where the land is opened by the solder resist is 0.7 mm or less, a crack defect hardly occurs.

However, when the thickness of the semiconductor chip is 150 μm or less, for example in the range of about 50 μm to about 150 μm, or when the width W1 (see FIG. 3) at which the land is opened by the solder resist is about 0.7 mm or higher, the crack defect has a greater chance of occurring. However, in the semiconductor package or the LGA package 100, which include a support layer according to an exemplary embodiment of the inventive concept, such defects can be lessened.

Figure 6:
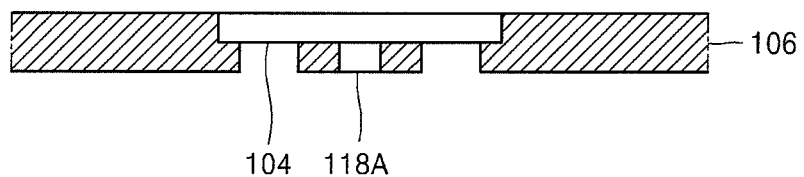
FIG. 6 is an enlarged cross-sectional view of portion A of FIG. 1 according to an exemplary embodiment of the inventive concept.
Figure 7:
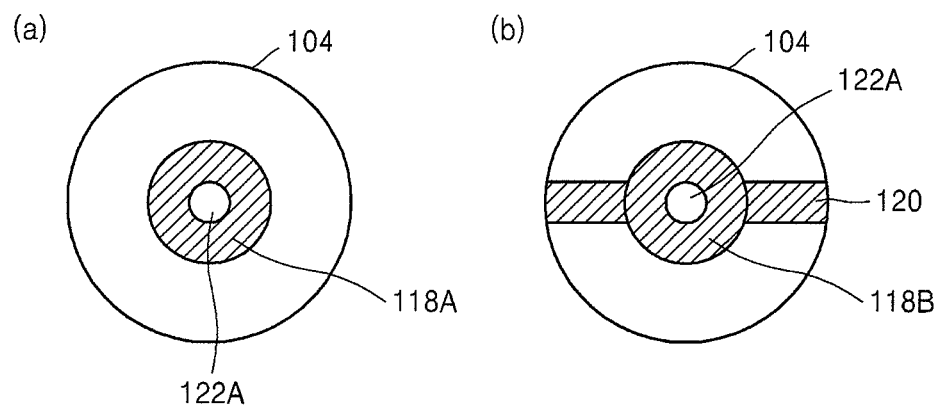
FIG. 7 is a plan view of the shape of a support layer formed in the LGA package of FIG. 6.

FIG. 6 is an enlarged cross-sectional view of portion A of FIG. 1 according to an exemplary embodiment of the inventive concept, and FIG. 7 is a plan view of the shape of a support layer 118A/118B formed in the LGA package of FIG. 6.

Referring to FIGS. 6 and 7, the LGA package 100 includes the support layer 118A that covers portions of the lands 104 on the surface of the lands 104 opened by the solder resist 106. The support layer 118A is circular ring-shaped. The support layer 118A may be formed by using the solder resist 106 when the substrate 110 (see FIG. 1) for manufacturing the semiconductor package is manufactured. In addition, the height of the support layer 118A may be equal to or smaller than that of the solder resist 106 formed on the bottom surface of the substrate 110. Thus, when bending occurs in a molding process or a process of handling the LGA package, the support layer 118A supports an area in which the semiconductor chip 108 (see FIG. 1) can sustain damage. Thus, a crack defect may be prevented from occurring to the semiconductor chip 108.

The support layer 118A may be formed of a resin such as an EMC instead of the solder resist 106 and may have various shapes. For example, the support layer 118A may be separated from the solder resist 106 formed on the bottom surface of the substrate 110 and may be separately present, like 118A in (a) of FIG. 7. The support layer 118A may be present with a connection portion 120 to connect the support layer to the solder resist 106, like 118B in (b) of FIG. 7.

In the LGA package or other types of semiconductor packages, after a packaging process is completed, an electrical final test for testing an electrical function of a semiconductor package is carried out in the lands 104. Thus, the support layer 118A should open a space of the land 104 for a POGO pin that is a connection terminal of the electrical test process. In FIG. 7, the connection terminal of the electrical function test may contact the land 104 through an area 122A in the midpoint of the support layers 118A and 118B.

Figure 8:
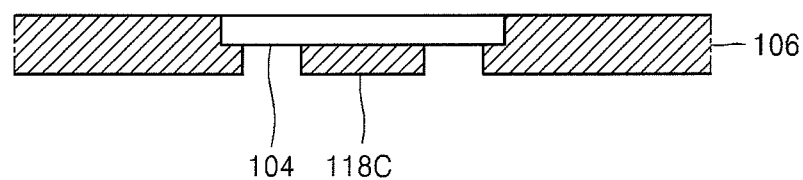
FIG. 8 is an enlarged cross-sectional view of portion A of FIG. 1 according to an exemplary embodiment of the inventive concept.
Figure 9:
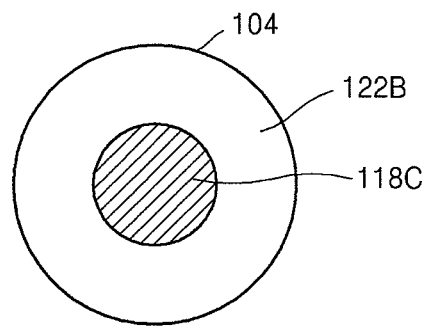
FIG. 9 is a plan view of the shape of a support layer formed in the LGA package of FIG. 8.

FIG. 8 is an enlarged cross-sectional view of portion A of FIG. 1 according to an exemplary embodiment of the inventive concept, and FIG. 9 is a plan view of the shape of a support layer 118C formed in the LGA package of FIG. 8.

Referring to FIGS. 8 and 9, the support layer 118C is circular, but does not have an internal cavity like that shown in FIG. 6. Thus, after the packaging process is completed, when an electrical function test of the semiconductor package is carried out in the land 104, the POGO pin that is the connection terminal of the electrical function test contacts an opened portion 122B of the land 104 formed at an outer circumference of the support layer 118C. In other words, the shape of the support layer 118C may be varied according to the shape of the POGO pin.

Figure 10:
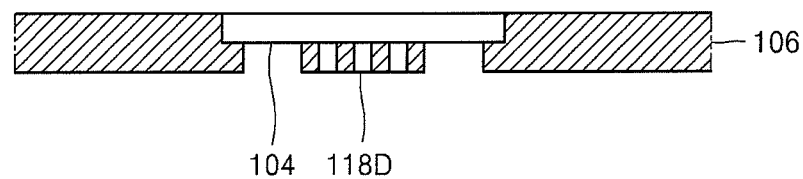
FIG. 10 is an enlarged cross-sectional view of portion A of FIG. 1 according to an exemplary embodiment of the inventive concept.
Figure 11:
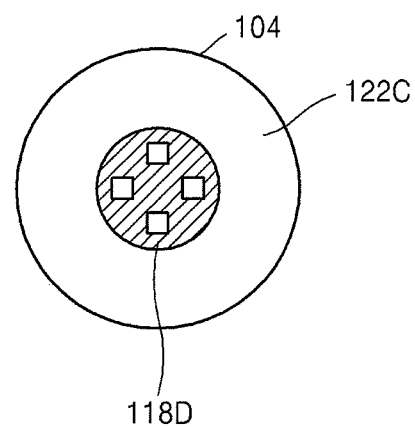
FIG. 11 is a plan view of the shape of a support layer formed in the LGA package of FIG. 10.

FIG. 10 is an enlarged cross-sectional view of portion A of FIG. 1 according to an exemplary embodiment of the inventive concept, and FIG. 11 is a plan view of the shape of a support layer 118D formed in the LGA package of FIG. 10.

Referring to FIGS. 10 and 11, the support layer 118D includes a plurality of separate layers formed of a solder resist connected to each other to have an area as large as possible and rectangular shapes is formed in the support layer 118D. An open area 122C surrounds the support layer 118D. Thus, after the packaging process is completed, when the electrical function test of the semiconductor package is carried out in the lands 104, the POGO pin that is a connection terminal of the electrical function test contacts the open area 122C so that the electrical function test of the semiconductor package may be carried out.

Figure 12:
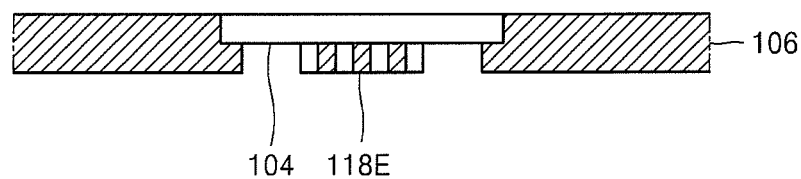
FIG. 12 is an enlarged cross-sectional view of portion A of FIG. 1 according to an exemplary embodiment of the inventive concept.
Figure 13:
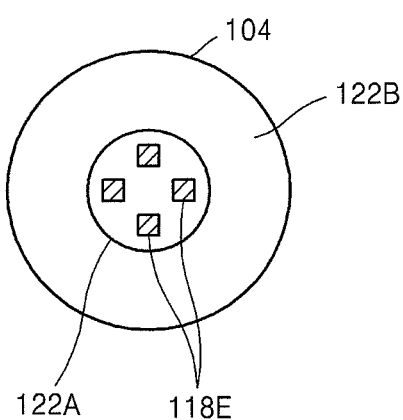
FIG. 13 is a plan view of the shape of a support layer formed in the LGA package of FIG. 12.

FIG. 12 is an enlarged cross-sectional view of portion A of FIG. 1 according to an exemplary embodiment of the inventive concept, and FIG. 13 is a plan view of the shape of a support layer 118E formed in the LGA package of FIG. 12.

Referring to FIGS. 12 and 13, the support layer 118E of the LGA package according to the current embodiment includes four separate rectangles. In contrast to some of the prior embodiments, the support layer 118E is not formed by connecting a plurality of separate layers but rather is independently present on the surface of the land 104. Thus, an opened area of the land 104 for contact of the POGO pin during the electrical function test may be an area that is arbitrarily selected from a central portion 122A of the support layer 118E and an outer circumferential portion 122B of the support layer 118E.

Figure 14:
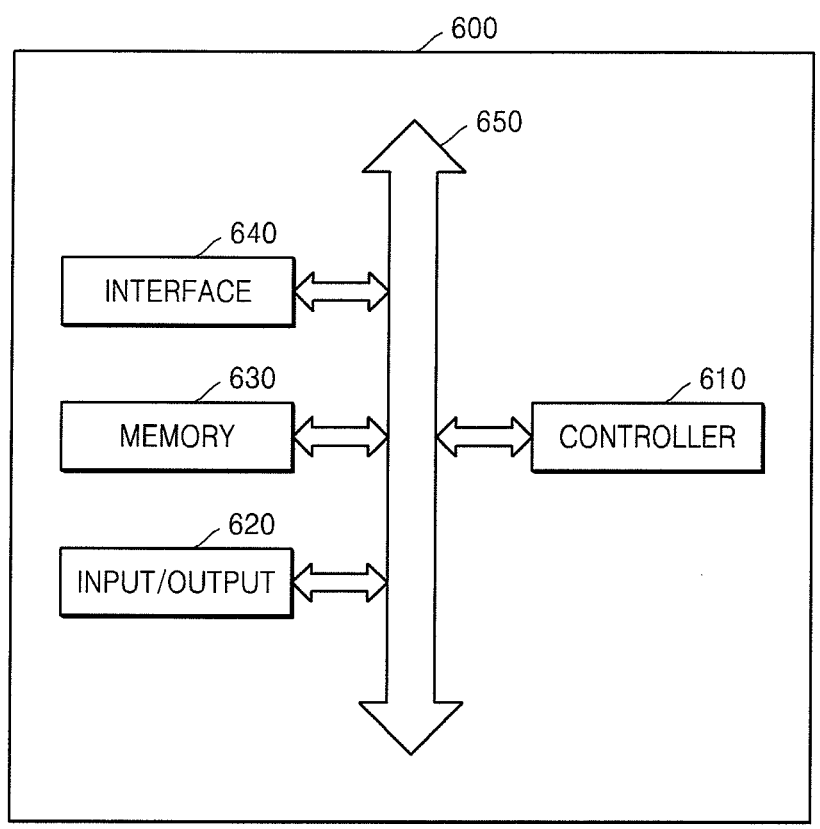
FIG. 14 is a block diagram of an electronic device including an LGA package capable of decreasing a height difference between a land and a solder resist, according to an exemplary embodiment of the inventive concept.

FIG. 14 is a block diagram of an electronic device 600 using an LGA package capable of decreasing a height difference between a land and a solder resist, according to an exemplary embodiment of the inventive concept. Referring to FIG. 14, the electronic device 600 may include a controller 610, an input/output unit 620, a memory unit 630, and an interface 640. The electronic device 600 may be a mobile system or a system for transmitting or receiving information. The mobile system may be a personal digital assistant (PDA), a portable computer, a web tablet, a wireless phone, a mobile phone, or a digital music player.

The controller 610 executes a program and controls the electronic device 600. The controller 610 may be a microprocessor, a digital signal processor, a microcontroller, or a similar device thereto. The input/output unit 620 may be used to input or output data of the electronic device 600. The electronic device 600 may be connected to an external device, such as a personal computer (PC) or a network and may exchange data with the external device by using the input/output unit 620. The input/output unit 620 may be a keypad, a keyboard, or a display. The memory unit 630 may store codes and/or data for operating the controller 610 or store data processed by the controller 610. The memory unit 630 or the controller 610 may be the LGA package 100 or a semiconductor package mounted on a PCB for driving an electronic device according to one of the exemplary embodiments of the inventive concept.

The interface 640 may be a data transmission path between the electronic device 600 and an external device. The controller 610, the input/output unit 620, the memory unit 630, and the interface 640 may communicate with one another via a bus 650. For example, the electronic device 600 may be used in a mobile phone, an MP3 player, a navigation system, a portable multimedia player (PMP), a solid state drive (SSD), or household appliances. Alternatively, the electronic device 600 may be a desktop computer, a notebook computer, an MP3 player, a PMP, a navigation system, an electronic dictionary, an external memory device, a mobile phone, medical equipment, an image reproducing device, a flat panel display, a surveillance camera system, or a database server.

As described above, in an LGA package, a semiconductor package and an electronic device according to an exemplary embodiment of the inventive concept, damage that may occur in a semiconductor chip can be prevented by decreasing a height difference between a solder resist and a land of a substrate for manufacturing the LGA/semiconductor package. To this end, a support layer formed of a solder resist on a surface of the lands formed on the substrate of the LGA package or the semiconductor package and having a height equal to or smaller than that of the solder resist formed on a bottom surface of the substrate, is separately formed. Thus, the support layer supports bending of the substrate on which the semiconductor chip is mounted to prevent cracks from occurring in the semiconductor chip during a molding or handling process.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. A land grid array (LGA) package, comprising:
   a substrate comprising a plurality of lands formed on a first surface of the substrate;
   a semiconductor chip mounted on a second surface of the substrate;
   a connection portion connecting the semiconductor chip and the substrate;
   a first solder resist formed on a surface of a first land at a first end of the first land and a second solder resist formed on the surface of the first land at a second end of the first land, wherein the first and second ends are opposite each other; and
   a support layer formed on part of the surface of the first land between the first solder resist and the second solder resist,
   wherein the support layer comprises a plurality of separate layers, and
   wherein a width of the first land between the first solder resist and the second solder resist is about 0.7 mm or higher.

2. The LGA package of claim 1, wherein the support layer and the first solder resist are formed of a different material.

3. The LGA package of claim 1, wherein a height of the support layer is equal to or smaller than a height of the first solder resist formed on the first surface of the substrate.

4. The LGA package of claim 1, wherein the semiconductor chip has a thickness of about 50 μm to about 150 μm.

5. The LGA package of claim 1, wherein the connection portion includes a wire.

6. The LGA package of claim 1, further comprising a sealing member sealing the second surface of the substrate and the semiconductor chip.

7. The LGA package of claim 1, wherein the support layer is connected to the first solder resist formed on the first surface of the substrate.

8. The LGA package of claim 1, wherein the support layer is not connected to the first solder resist formed on the first surface of the substrate.

9. The LGA package of claim 1, wherein the support layer is formed by connecting a plurality of separate layers.

10. A semiconductor package, comprising:
    a substrate comprising a plurality of lands formed on a first surface of the substrate;
    a semiconductor chip mounted on a second surface of the substrate;
    a sealing member sealing the second surface of the substrate and the semiconductor chip;
    a first solder resist formed on a surface of a first land at a first end of the first land and a second solder resist formed on the surface of the first land at a second end of the first land, wherein the first and second ends are opposite each other; and
    a support layer formed on part of the surface of the first land between the first solder resist and the second solder resist,
    wherein a width of the first land between the first solder resist and the second solder resist is about 0.7 mm or higher.

11. The semiconductor package of claim 10, wherein the support layer and the first solder resist are formed of a different material.

12. The semiconductor package of claim 10, wherein a height of the support layer is equal to or smaller than a height of the first solder resist formed on the first surface of the substrate.

13. The semiconductor package of claim 10, wherein the semiconductor chip has a thickness of about 50 μm to about 150 μm.

* * * * *